US006838876B2

(12) United States Patent
Kruspe et al.

(10) Patent No.: US 6,838,876 B2
(45) Date of Patent: Jan. 4, 2005

(54) SLOTTED NMR ANTENNA COVER (75) Inventors: Thomas Kruspe, Wienhausen (DE); Martin Blanz, Celle (DE); Peter Rottengatter, Isernhagen (DE)

(73) Assignee: Baker Hughes Incorporated, Houston, TX (US)

(*) Notice: Subject to any disclaimer, the term of this patent is extended or adjusted under 35 U.S.C. 154(b) by 0 days.

(21) Appl. No.: 10/146,534

(22) Filed: May 15, 2002

(65) Prior Publication Data

US 2003/0155915 A1 Aug. 21, 2003

Related U.S. Application Data (60) Provisional application No. 60/357,748, filed on Feb. 18, 2002.

(51) Int. Cl.[7] ................................................ G01V 3/00
(52) U.S. Cl. ...................................................... 324/303
(58) Field of Search ......................................... 324/303

(56) References Cited

U.S. PATENT DOCUMENTS

| | | | | |
|---|---|---|---|---|
| 3,268,800 A | * | 8/1966 | Hohn Jr. et al. | 324/303 |
| 3,597,681 A | * | 8/1971 | Huckabay et al. | 324/303 |
| 3,617,867 A | * | 11/1971 | Herzog | 324/303 |
| 3,667,035 A | * | 5/1972 | Slichter | 324/303 |
| 4,536,714 A | | 8/1985 | Clark | |
| 4,651,101 A | | 3/1987 | Barber et al. | |
| 4,785,247 A | | 11/1988 | Meador et al. | |
| 4,792,757 A | | 12/1988 | Vail, III et al. | |
| 5,280,243 A | * | 1/1994 | Miller | 324/303 |
| 5,557,201 A | * | 9/1996 | Kleinberg et al. | 324/303 |
| 5,563,512 A | | 10/1996 | Mumby | |
| 5,629,623 A | | 5/1997 | Sezginer et al. | |
| 5,705,927 A | * | 1/1998 | Sezginer et al. | 324/303 |
| 5,914,598 A | * | 6/1999 | Sezginer et al. | 324/303 |
| 6,163,153 A | * | 12/2000 | Reiderman et al. | 324/314 |
| 6,268,726 B1 | * | 7/2001 | Prammer et al. | 324/303 |
| 6,288,548 B1 | | 9/2001 | Thompson et al. | |
| 6,362,619 B2 | * | 3/2002 | Prammer et al. | 324/303 |
| 6,538,440 B2 | * | 3/2003 | Dean et al. | 324/318 |
| 6,559,640 B2 | * | 5/2003 | Taicher | 324/303 |
| 6,577,244 B1 | * | 6/2003 | Clark et al. | 340/854.6 |

* cited by examiner

*Primary Examiner*—Diego Gutierrez
(74) *Attorney, Agent, or Firm*—Madan, Mossman & Sriram, P.C.

(57) ABSTRACT

A slotted NMR antenna cover for improved mechanical ruggedness during transmission and reception of NMR signals in a down hole environment during either MWD or wire line operations. A NMR slotted antenna cover is provided comprising an elongated tubular structure with longitudinal gaps or slots filled with a RF transmissive or non-conductive material. The slots can befilled at the slot ends with soft magnetic material to improve efficiency of the antenna. The slots are radial concave to reduce eddy currents induced by alternating magnetic flux entering and leaving the slots surrounding the antenna. In another embodiment, the antenna cover is RF transmissive on only a portion of the antenna, via slots or transmissive material, so that the antenna cover can be used to allow RF transmission from the antenna in a side looking or beam pattern restricted mode only.

18 Claims, 5 Drawing Sheets

SLOTTED NMR ANTENNA COVER

CROSS REFERENCE TO RELATED APPLICATIONS

The following application claims priority from U.S. Provisional Patent Application No. 60/357,748 entitled Method and Apparatus for NMR Antenna with Slotted Metal Cover by Kruspe et al, which was filed on Feb. 18, 2002, which is hereby incorporated herein by reference in its entirety. This application is related to U.S. Pat. No. 6,163,153 by Reiderman et al, entitled Nuclear Magnetic Resonance Pulse Sequence for Optimizing Instrument Electrical Power Usage which is hereby incorporated herein by reference in its entirety.

BACKGROUND OF THE INVENTION

1. Field of the Invention

The present invention relates to a slotted antenna cover for protection of the RF antenna of a nuclear magnetic resonance (NMR) tool.

2. Background of the Related Art

To obtain hydrocarbons such as oil and gas, a drilling assembly (also referred to as the "bottom hole assembly" or the "BHA") carrying a drill bit at its bottom end is conveyed into the well bore or borehole. The drilling assembly is usually conveyed into the well bore by a coiled-tubing or a drill pipe. In the case of the coiled-tubing, the drill bit is rotated by a drilling motor or "mud motor" which provides rotational force when a drilling fluid is pumped from the surface into the coiled-tubing. In the case of the drill pipe, it is rotated by a power source (usually an electric motor) at the surface, which rotates the drill pipe and thus the drill bit.

Bottom hole assemblies ("BHA") generally include several formation evaluation sensors for determining various parameters of the formation surrounding the BHA during the drilling of the well bore. Such sensors are usually referred to as the measurement-while-drilling ("MWD") sensors. Sensors are also deployed after the borehole drilling has been completed. Depending a sensory device down hole via a wire line performs such operations.

Such sensors, whether MWD or wire line, have traditionally utilized electromagnetic propagation sensors for measuring the resistivity, dielectric constant, water saturation of the formation, and nuclear sensors for determining the porosity of the formation and acoustic sensors to determine the formation acoustic velocity and porosity. Other down hole sensors that have been used include sensors for determining the formation density and permeability. The bottom hole assemblies also include devices to determine the BHA inclination and azimuth, as well as pressure sensors, temperature sensors, gamma ray devices, and devices that aid in orienting the drill bit in a particular direction and to change the drilling direction. Acoustic and resistivity devices have been proposed for determining bed boundaries around and in some cases in front of the drill bit. NMR sensors as MWD sensors as well as wire line sensors can provide direct measurement for porosity, water saturation and indirect measurements for permeability and other formation parameters of interest.

NMR sensors utilize permanent magnets to generate a static magnetic field, $B_0$ in a formation surrounding the borehole in which the MWD or wire line tool is deployed. Typically a radio frequency (RF) solenoid coil is disposed between the permanent magnets or around the magnets to induce an RF magnetic field into the formation. The magnets and the RF coils are positioned so that the static magnetic field $B_0$ and the RF field occur perpendicular to each other in at least a portion of the formation surrounding the bore hole and the NMR tool. In the region of interest, or region of investigation, where the RF and $B_0$ fields are perpendicular to each other, NMR measurements are made to determine parameters of interest for the surrounding formation.

In MWD operations, NMR sensors can be located inside and outside of a drill collar for performing measurements on the formation and its fluid content. A conventional MWD drill collar comprises a metallic structure that conveys rotational torque required during drilling operations. Moreover, the drill collar provides a hollow center section that provides a conduit for the drilling fluid or drilling mud that is used to lubricate the drill bit and carry the drilled cuttings from the borehole to the surface. Since NMR radio frequency electromagnetic fields do not penetrate the metallic body of the drill collar, electromagnetic field sensors typically are mounted outside of the metallic drill collar body. Because these NMR sensors are on the outside of the drilling collar, they are exposed to the abrasive rock in the formation during drilling operations and are thus subject to abrasion and wear resulting from particles in the drilling mud and the impact of the sensor against the earth formation during drilling.

A typical MWD tool is described in EP-A-0581666 (Kleinberg). The MWD tool comprises a tubular drill collar, a drill head positioned at an axial end of the drill collar, and an NMR sensor. The NMR sensor comprises a pair of tubular main magnets, which generate a static ($B_0$) magnetic field, each of which is located in an internal recess of the drill collar. The Kleinberg tool provides an RF antenna located in an external recess in the drill collar between the main magnets. The RF antenna recess is optionally filled with a magnetically soft ferrite to improve the efficiency of the antenna.

U.S. Pat. No. 6,288,548 discloses a slotted metal tubular having axial slots to allow inward and outward passage of electromagnetic fields for resistivity measurements. This configuration is too lossy to be used with NMR sensors due to the production of eddy currents.

Known down hole NMR tools use resonating antennas for radiating RF electromagnetic NMR pulses and/or receiving alternating magnetic fields at the resonance frequency of the detected NMR. Typically the NMRantenna is a simple solenoid coil in combination with an attached capacitor to form a resonating circuit. The typical NMRantenna is protected against wear and deterioration or failure due to the abrasive effects on the antenna from exposure to the formation during drilling operations. The protection is effected by a cover made from ceramics, rubber, epoxy or other electrically non-conductive material. All these materials have major disadvantages. They are either brittle (ceramic) or soft. Thus, there is a need for an NMR antenna cover with better mechanical robustness. Therefore there is a need for a NMR antenna cover, made from tough metal, that does not significantly reduce efficiency of the antenna through the production of eddy currents.

SUMMARY OF THE INVENTION

The apparatus and method of the present invention overcome the disadvantages of known down hole NMR tools. The present invention provides a slotted NMR antenna cover for improved mechanical ruggedness during transmission and reception of NMR signals in a down hole environment during either MWD or wire line operations. In one aspect of the present invention a slotted NMR antenna cover is presented, comprising an elongated tubular structure with longitudinal gaps or slots filled with a RF transmissive or non-conductive material. In another embodiment, the slots are filled at the slot ends with soft magnetic material to improve efficiency of the antenna. The ribs between the slots (in the following simply called ribs) have edges that are radial convex to reduce power dissipation in eddy currents induced by electromagnetic energy entering and leaving the slots surrounding the antenna. In another embodiment, the antenna cover is RF transmissive on only a portion of the antenna, via slots or transmissive material, so that the antenna cover can be used to allow RF transmission from the antenna in a side looking or beam pattern restricted mode only. The slotted NMR antenna cover can be deployed in a MWD environment on a tool having a fixed attachment to the drill string or rotationally attached to the drill string on a non-rotating sleeve surrounding the drill string. The present invention can also be deployed on a NMR tool deployed in a borehole via a wire line.

In one preferred embodiment, the slotted antenna cover includes a plurality of axial slots in a metal skeletal structure. The slots are filled with non-conducting or poorly-conducting material, which allow for the passage of the interrogating electromagnetic field from the central bore of the measurement tubular to the borehole and surrounding formation. In another preferred embodiment, the ends of the slots are filled with a soft magnetic material such as ferrite or powdered iron bound in an epoxy binder. The soft magnetic material lowers the magnetic reluctance of the RF transmission and reception path through the antenna cover slots, thereby increasing the efficiency of the antenna and slotted antenna cover combination. The slot edges are smoothed and curved to decrease power losses associated to the eddy currents that would accumulate at a sharp edge.

Up to now it was generally assumed that such a metal cover is not feasible for NMR as the NMR method would suffer badly from any RF power losses in such a cover, while transmitting and while receiving RF. But now the inventors have shown that the power losses effected by a specially slotted metal cover are small enough to be tolerated in the NMR measurement, provided the design of the cover is optimized.

It is one objective of the present invention to provide an improved measurement-while-drilling NMR system which utilizes a slotted NMR antenna cover which is at least partially formed of metal with the material advantage of strength, toughness and resistance to wear and abrasion but at the same time enables alternating magnetic flux to pass through this cover by also providing slots filled with a material which is non-conducting or poorly-conducting. The present invention also increases the efficiency of an NMR antenna by reducing eddy currents induced by the incoming and outgoing magnetic field. Longitudinal slots are formed in the antenna cover. The slots are air-filled or filled with materials of varying electromagnetic and electrical properties. The edges of the antenna cover ribs are curved in radial direction to reduce concentration of eddy currents, which would migrate toward a sharper edge on the rib if the rib edge were not curved. A soft magnetic material is inserted in the ends of each slot to reduce the reluctance encountered by RF electromagnetic energy incoming and outgoing through the NMR antenna cover slots. This soft magnetic material can be for example ferrite or powdered iron or preferably layered material made of amorphous metal ribbon or other very thin ferromagnetic foil with high magnetic permeability. These and other objectives are achieved as is now described in the context of a NMR MWD operation.

DETAILED DESCRIPTION OF A PREFERRED EMBODIMENT

The present invention can be deployed in a MWD operation on a non-rotating sleeve surrounding the drill string or fixed to the drill string. The present invention may also be deployed on a wire line. The present invention provides a rugged NMR antenna cover, which in a preferred embodiment is a slotted metal cylinder surrounding the antenna to protect it from abrasive effects of drilling. RF transmissive portions are formed in the antenna cover to enable RF radiation to enter and exit the RF transmissive portions. The RF electromagnetic flux exits one end of the transmissive portion or slot, passes through the formation and reenters the other end of the transmissive portion or slot, thus substantially canceling eddy currents induced by the electromagnetic fields entering and leaving the antenna cover slots. Or otherwise expressed the net flow of field through a slot is zero and for this reason no eddy current is formed around the slot.

Figure 1:
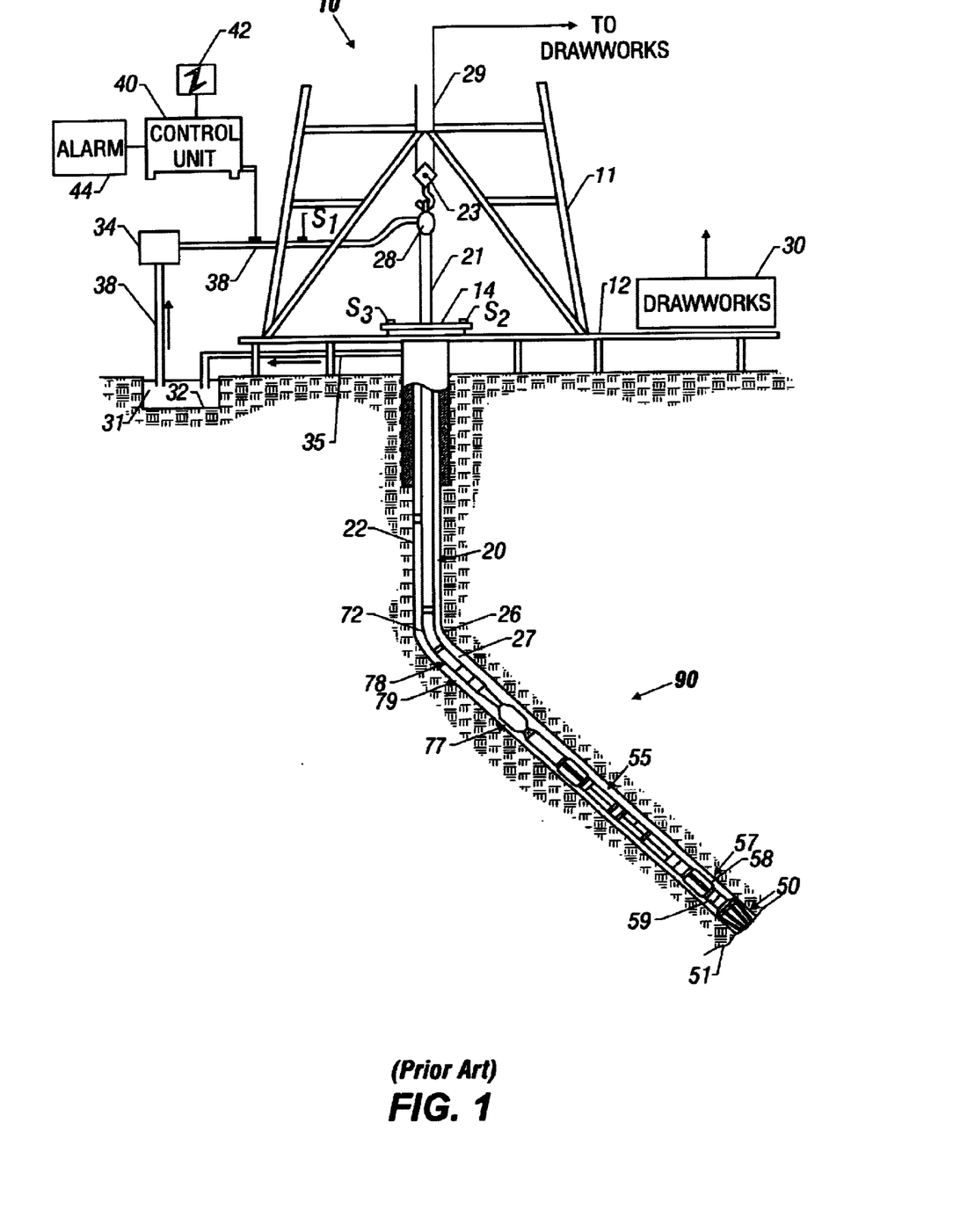
FIG. 1, is an illustration of the present invention deployed in a down hole environment.

FIG. 1 illustrates a schematic diagram of a drilling system 10 with a drill string 20 carrying a drilling assembly 90 (also referred to as the bottom hole assembly, or "BHA") conveyed in a "well bore" or "borehole" 26 for drilling the well bore. The drilling system 10 includes a conventional derrick 11 erected on a floor 12 which supports a rotary table 14 that is rotated by a prime mover, such as an electric motor (not shown), at a desired rotational speed. The drill string 20 includes tubing such as a drill pipe 22 or a coiled-tubing extending downward from the surface into the borehole 26. The drill string 20 is pushed into the well bore 26 when a drill pipe 22 is used as the tubing. For coiled-tubing applications, a tubing injector (not shown), is used to move the tubing from a source thereof, such as a reel (not shown), to the well bore 26. The drill bit 50 attached to the end of the drill string breaks up the geological formations when it is rotated to drill the borehole 26. If a drill pipe 22 is used, the drill string 20 is coupled to a draw works 30 via a Kelly joint 21, swivel 28 and line 29 through a pulley 23. During drilling operations, the draw works 30 is operated to control the weight on bit, which is an important parameter that affects the rate of penetration. The operation of the draw works is well known in the art and is thus not described in detail herein.

During drilling operations, a suitable drilling fluid 31 from a mud pit (source) 32 is circulated under pressure through a channel in the drill string 20 by a mud pump 34. The drilling fluid passes from the mud pump 34 into the drill string 20 via a desurger 36, fluid line 38 and Kelly joint 21. The drilling fluid 31 is discharged at the borehole bottom 51 through an opening in the drill bit 50. The drilling fluid 31 circulates up hole through the annular space 27 between the drill string 20 and the borehole 26 and returns to the mud pit 32 via a return line 35. The drilling fluid acts to lubricate the drill bit 50 and to carry borehole cuttings or chips away from the drill bit 50. A sensor S1 preferably placed in the line 38 provides information about the fluid flow rate. A surface torque sensor S2 and a sensor S3 associated with the drill string 20 respectively provide information about the torque and rotational speed of the drill string. Additionally, a sensor (not shown) associated with line 29 is used to provide the hook load of the drill string 20.

In one embodiment of the invention, the drill bit 50 is rotated by rotating the drill pipe 22. In another embodiment of the invention, a down hole motor 55 (mud motor) is disposed in the drilling assembly 90 to rotate the drill bit 50 and the drill pipe 22 is rotated usually to supplement the rotational power, if required, and to effect changes in the drilling direction.

In the preferred embodiment of FIG. 1, the mud motor 55 is coupled to the drill bit 50 via a drive shaft (not shown) disposed in a bearing assembly 57. The mud motor rotates the drill bit 50 when the drilling fluid 31 passes through the mud motor 55 under pressure. The bearing assembly 57 supports the radial and axial forces of the drill bit. A stabilizer 58 coupled to the bearing assembly 57 acts as a centralizer for the lowermost portion of the mud motor assembly.

In one embodiment of the invention, a drilling sensor module 59 is placed near the drill bit 50. The drilling sensor module contains sensors, circuitry and processing software and algorithms relating to the dynamic drilling parameters. Such parameters preferably include bit bounce, stick-slip of the drilling assembly, backward rotation, torque, shocks, borehole and annulus pressure, acceleration measurements and other measurements of the drill bit condition. A suitable telemetry or communication sub 72 using, for example, two-way telemetry, is also provided as illustrated in the drilling assembly 90. The drilling sensor module processes the sensor information and transmits it to the surface control unit 40 via the telemetry system 72.

The communication sub 72, a power unit 78 and an MWD tool 79 are all connected in tandem with the drill string 20. Flex subs, for example, are used in connecting the MWD tool 79 in the drilling assembly 90. Such subs and tools form the bottom hole drilling assembly 90 between the drill string 20 and the drill bit 50. The MWD-tool 79 makes various measurements including the nuclear magnetic resonance measurements while the borehole 26 is being drilled. The communication sub 72 obtains the signals and measurements and transfers the signals, using two-way telemetry, for example, to be processed on the surface. Alternatively, the signals can be processed using a down hole processor in the MWD-tool 79.

The surface control unit or processor 40 also receives signals from down hole sensors and devices via the communication sub 72 and signals from sensors S1–S3 and other sensors used in the system 10 and processes such signals according to programmed instructions provided to the surface control unit 40. The surface control unit 40 displays desired drilling parameters and other information on a display/monitor 42 utilized by an operator to control the drilling operations. The surface control unit 40 preferably includes a computer or a microprocessor-based processing system, memory for storing programs or models and data, a recorder for recording data, and other peripherals. The control unit 40 is preferably adapted to activate alarms 44 when certain unsafe or undesirable operating conditions occur.

Figure 2:
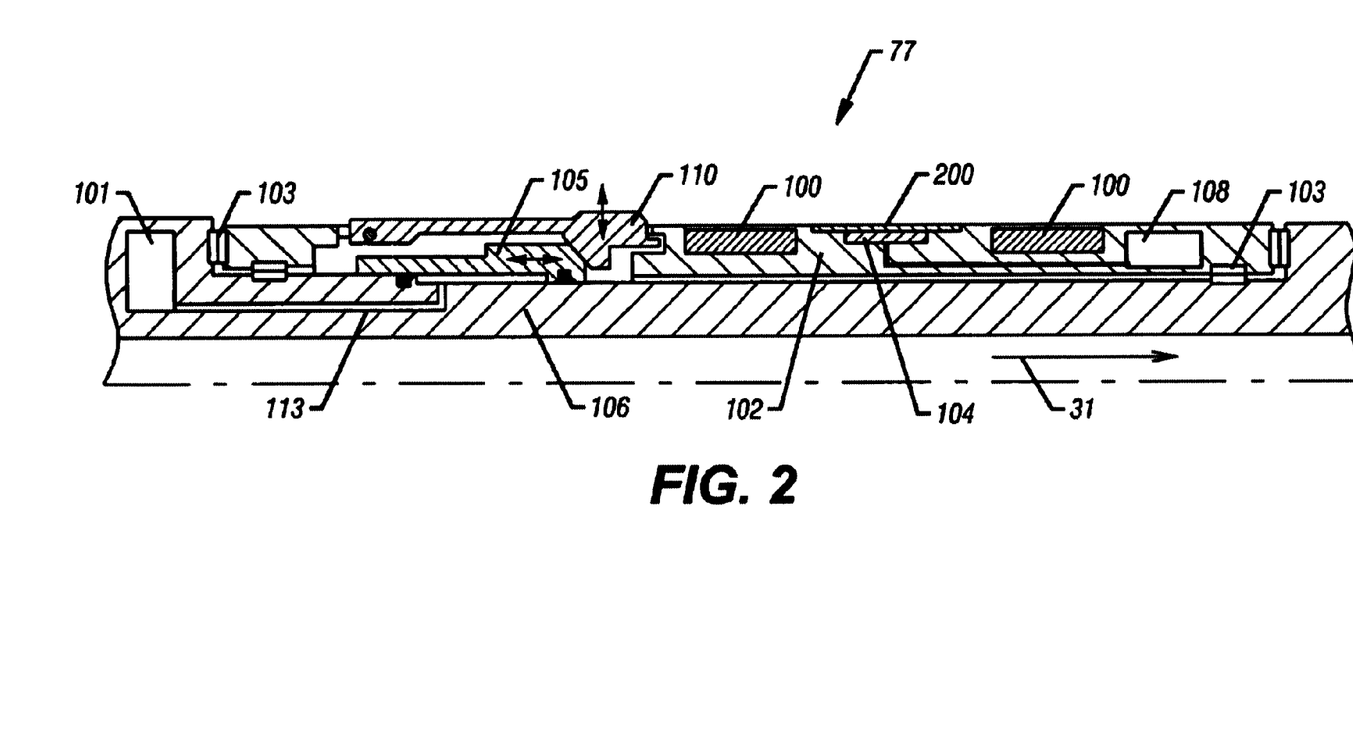
FIG. 2, is a cross sectional view of the present invention in a preferred embodiment.

A segment, the NMR-MWD sensor, 77 of MWD tool 79, illustrated in greater detail in FIG. 2 illustrates a preferred embodiment of the apparatus and method according to the present invention including a slotted antenna cover covering a sleeve member sensor assembly, which in a preferred embodiment is slidably coupled to a longitudinal member, such as a section of drill pipe, wherein, when the sleeve member is non-rotating and the longitudinal member is free to rotate. Alternatively, the present invention may also be fixed to the drill string. In the preferred embodiment, the sleeve member may be held in a non-rotating position through clamping engagement with the borehole wall. Decoupling of the sleeve member and the rotating drill string is achieved by shock absorbers. The assembly is additionally equipped with knuckle joints to decouple the sleeve member from bending moments. An additional thruster is provided in the drill string between sleeve member and down hole motor or drill bit in order to additionally decouple axial vibrations. The sleeve member, including the sensor assembly illustrated in the following FIG. 2, describes a nuclear magnetic resonance device according to the present invention. However, the apparatus and method according to the present invention can be adapted for any MWD device or tool typically used on a rotating drill string.

Turning now to FIG. 2, a schematic representation of a partial cross-section of a NMR tool and drill collar comprising permanent magnets 100 on a non-rotating sleeve 102 in accordance with one embodiment of the present invention is illustrated. Slotted antenna cover 200 surrounds NMR antenna 104. RF transmissive slotted antenna cover 200 allow NMR RF fields to pass from antenna 104 into the formation and return to the NMR antenna 104. As shown in FIG. 2, non-rotating sleeve 102 houses permanent magnets 100 and clamping rib 110. Clamping rib 110 rotationally fixes non-rotating sleeve 102 with permanent magnets 100 and NMR antenna 104 relative to the formation when pushed out by a clamping piston 105. The clamping piston is activated and retracted by clamping hydraulics 101 via hydraulic line 113 according to the timing of the measurement. Fixation of and non-rotating sleeve 102 with magnets 100 and NMR antenna 104 with respect to the wellbore and adjacent formation effectively decouples the non-rotating sleeve 102 from laterally movement of drill collar 106 and forces the NMR-sensor to a momentarily rest during drilling operations. Bearings 103 and shock absorbers, not shown, such as rubber blocks are implemented to effectively decouple the non-rotating sleeve. Receiving and transmitting NMR antenna 104 and NMR electronics 108 are provided on the non rotating sleeve 102. The rotating drill collar 106 carries the drilling mud 31 through the NMR-MWD sensor 77. The transmitter and receiver RF-field penetrates through the slotted NMR antenna cover 200 mounted as a part of the non rotating sleeve covering the NMR antenna. The configuration of FIG. 2 provides the advantage of de-coupling the permanent magnets and the NMR-antenna from the rotating drill string during the period of NMR measurement time. This will effectively keep the static magnetic field and the radio frequency field constant in the formation during the period of measurement.

Figure 3:
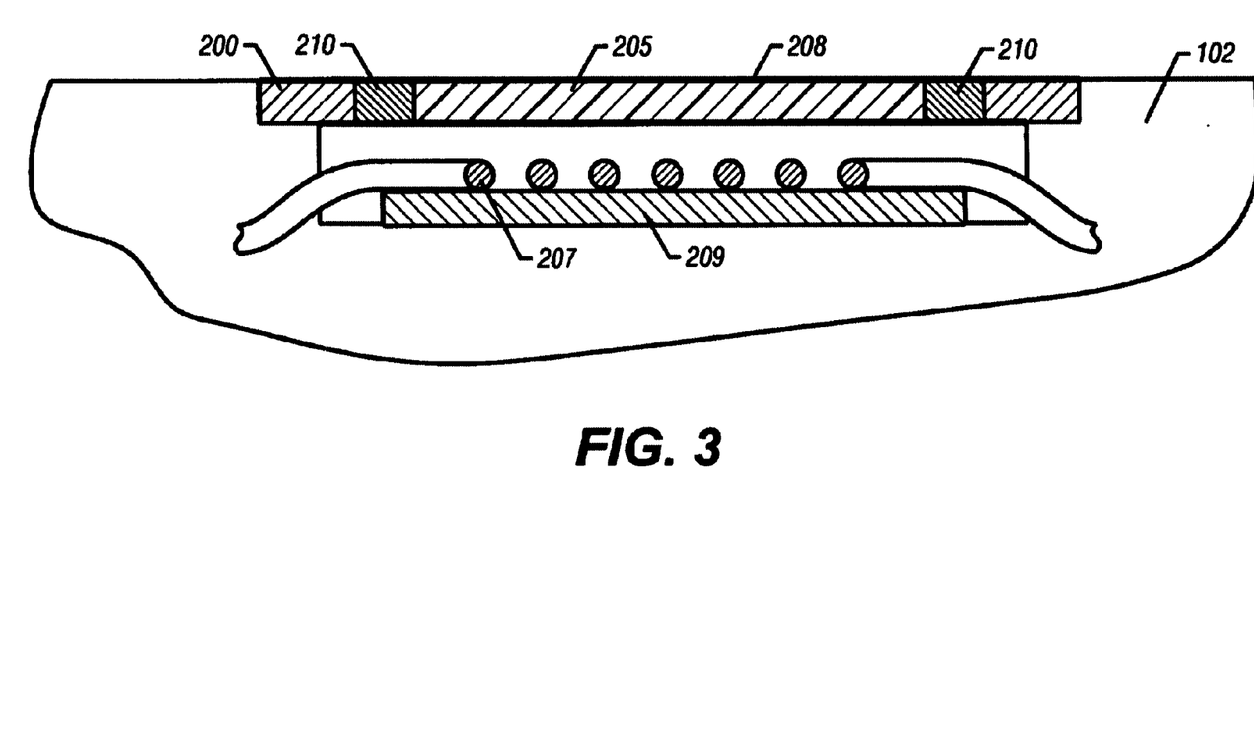
FIG. 3, is a more detailed view on a preferred embodiment of the antenna section of a NMR-MWD sensor.

FIG. 3 shows a more detailed view on a preferred embodiment of the antenna section of a NMR-MWD sensor. As shown in FIG. 3, the antenna windings 207 are placed in a recess of the body of the non-rotating sleeve 102. They are applied of a RF-flux guiding soft magnetic material 209 such as ferrite or powdered iron. The recess in the body is covered by a slotted antenna cover 200 comprising slots 205, additional soft magnetic material 205 in the slots and the surface 208, which is covered by a highly conductive coating such as a galvanic copper coating.

Figure 4:
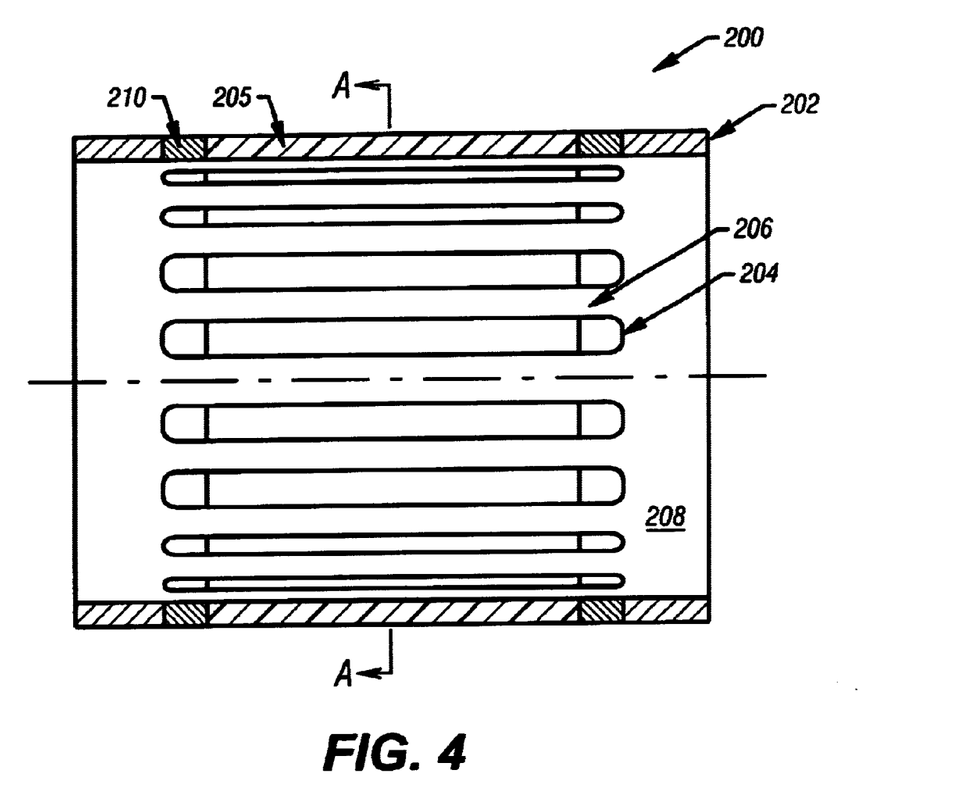
FIG. 4, is a side view of a preferred embodiment of the present invention.

FIG. 4 shows a cross section of the antenna cover 200. As shown in FIG. 4, in a preferred embodiment, the antenna cover 200 is made of stainless steel 5 millimeters thick 202 with 10-millimeter wide slots 204 separated by a 10-millimeter wide rib 206 between each slot 204. The surface 208 of the stainless steel antenna cover 200 is galvanized with copper to reduce resistance and reduce losses from induced eddy currents. The antenna cover slots 204 may be filled with any material 205, for example, rubber, reinforced plastic, epoxy, or any substance that enables passage of electromagnetic energy through the slots. Preferably, the slot-filling material is non-electrically conducting. The ends of the slots may be filled with soft magnetic material 210 such as powdered iron bound in epoxy to increase magnetic permeability at the ends of the slots. While slots are shown in the preferred embodiment, any transmissive section formed in the antenna cover is within the scope of the invention. In a preferred embodiment, the slots 204 and ribs 206 circumscribe the circumference of the antenna cover, however, in an alternative embodiment, the slot and ribs can cover less than all of the antenna cover circumference, such as, covering only half or one-fourth of the antenna cover circumference to form a side-looking NMR antenna transmission and reception pattern. Alternatively, some of the slots can be formed and filled with non-RF transmissive material to block RF emissions in order to form a side-looking or beam-forming antenna cover. The slotted antenna cover of the present invention may also be made from beryllium copper or a copper nickel alloy. These materials are wear resistant and desirable for their ruggedness and resistance to abrasion in the down hole environment.

Figure 5:
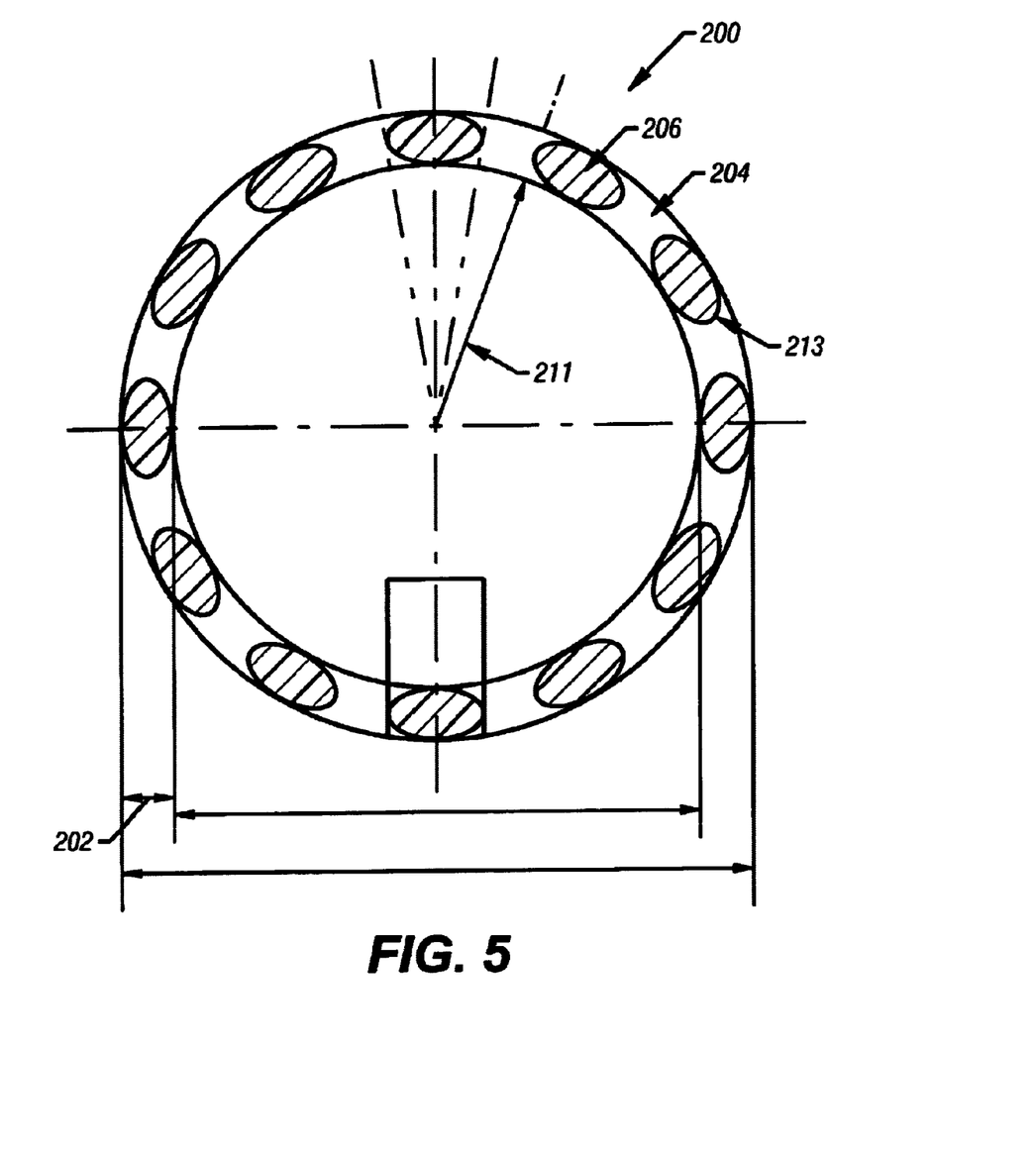
FIG. 5, is a cross section taken along section line A—A of FIG. 4.

FIG. 5, shows a cross section of the slotted antenna cover along line AA shown in FIG. 4. The slots in the cover run along the longitudinal axis of the tool. As shown in FIG. 5, in the radial direction 211, perpendicular to the longitudinal axis of the slots and ribs, each rib has a curved preferably convex edge 213, to reduce the concentration of eddy currents. Eddy currents would otherwise tend to concentrate on the sharp edges of ribs and would cause increased RF power loss.

For purposes of this disclosure, non-conducting materials are defined as those materials which have bulk resistivity values which are greater than 100 Ohm-meters. Also, for purposes of this disclosure, conducting materials are defined as having a resistivity of less than 0.001 ohm-meters. Antenna cover 200 need merely be sufficiently strong to provide mechanical strength and if mounted as part of the drill string, convey well bore fluids, but while also allowing electrical sensors located within the interior of NMR tool antenna to transmit and receive alternating magnetic fields which are too high in frequency to penetrate the conventional steel drill collars. A slotted metal cover as described shields alternating electric fields when the cover is grounded, but lets pass alternating magnetic fields. The shielding of electric fields from the sensor is a further advantage of this arrangement. Steel collars respond to high frequency electric and/or magnetic alternating fields by the generation of eddy currents, which dissipate the field and prevent the communication inward or outward of alternating electric and/or magnetic fields. This property gives an additional advantage of the present invention, because the slotted antenna cover can be penetrated by the alternating magnetic fields, it is up to a certain extend a shield for high-frequency electric fields which may interfere with the measurement.

The antenna cover described here can alternatively be made of a composite material. In case this composite material is reinforced with carbon fibers, it is conductive and would present a shield for the RF-magnetic field transmitted and received from the NMR-sensor. A conductive composite material could be made transparent to the RF-magnetic field by embedding certain sections of non conductive material which can be reinforced by non-conductive fibers, for instance Kevlar. Alternating sections of carbon-fibers and Kevlar fibers would form a cover tube with non-conducting windows for the transition of RF-magnetic fields. An example of one type of composite tubulars which are currently being utilized in the oil and gas industry are composite drill pipes, casing pipes, and tubing pipes manufactured by Brunswick Composites, a unit of the Brunswick Technical Group, having a business and correspondence address in Lincoln, Nebr., which offers for sale composite tubular, which have a strength many times greater than that found in steel tubulars, with much less weight, and virtual immunity to corrosion. An article entitled "Developments in Composite Structures for the Offshore Oil Industry" by J. G. Williams of Conoco, Inc., published in May of 1991 at the Offshore Technology Conference, and identified by OTC No. 6579, provides a detailed statement of the current utilization of composite materials in offshore oil and gas activities. Among the numerous uses of composite materials identified in this article is the use of composite drill pipe which has demonstrated its ability to withstand the forces encountered during drilling operations. Numerous composite materials are identified in this article including composites based upon carbon-fibers, KEVLAR 29, and KEVLAR 49.

While a preferred embodiment of the present invention has been presented, it is intended as an example only and should not be construed as limiting the invention, which is described by the following claims.

What is claimed is:

1. A nuclear magnetic resonance tool for obtaining information regarding a parameter of interest for a formation adjacent a bore hole, comprising:
    an NMR tool having an antenna for generating and receiving alternating magnetic fields in and from the formation; and
    a conductive cover for the antenna for protecting the NMR antenna from abrasion and for shielding the antenna from high frequency electric fields that interfere with the measurement signal, the cover further comprising at least one RF transmissive slot portion for enabling RF magnetic field to pass through the RF transmissive slot portion wherein the RF transmissive portion further comprises a slot having an edge with a curved radial cross section for the reduction of power loss due to eddy currents.

2. The NMR tool of claim 1, further comprising: a non-conductive material inserted into the RF transmissive slot portion.

3. The NMR tool of claim 1, wherein the conductive cover made from metal.

4. The NMR tool of claim 1, wherein the conductive cover made from composite material.

5. The NMR tool of claim 1, further comprising: a soft magnetic material inserted into each end of the RF transmissive slot portion.

6. The NMR tool of claim 1, wherein the cover further comprises: at least one RF transmissive slot portion positioned to provide a side-looking NMR antenna pattern.

7. The NMR tool of claim 1, further comprising: a conductive coating applied to the cover to reduce power dissipation by eddy currents induced on the body of the cover.

8. The NMR tool of claim 1, further comprising: a modified CPMG pulse train for exciting the antenna.

9. The NMR tool of claim 1 further comprising: A electrical ground connected to the conductive cover for shielding the NMR antenna from alternating electric fields.

10. A method for obtaining information regarding a parameter of interest for a formation adjacent a bore hole, comprising:
- deploying an NMR tool having an NMR antenna into a well bore in a formation; generating and receiving alternating magnetic fields in the NMR antenna in and from the formation; surrounding the NMR antenna with a conductive cover for the antenna for protecting the NMR antenna from abrasion and for shielding the antenna from high frequency electric fields that interfere with the measurement signal;
- forming in the cover further comprising at least one RF transmissive slot portion for enabling RF magnetic field to pass through the RF transmissive slot portion; and
- forming a curved radial cross section along the edges of RF transmissive portion for the reduction of power loss due to eddy currents.

11. The method of claim 10, further comprising: inserting a a non-conductive material into the RF transmissive slot portion.

12. The method of claim 10, further comprising: making the conductive cover from metal.

13. The method of claim 10, further comprising: Making the conductive cover made from composite material.

14. The method of claim 10, further comprising: inserting a soft magnetic material into each end of the RF transmissive slot portion.

15. The method of claim 10, further comprising: positioning at least one RF transmissive slot portion to provide a side-looking NMR antenna pattern.

16. The method of claim 10, further comprising: applying a conductive coating to the cover to reduce power dissipation by eddy currents induced on the body of the cover.

17. The method claim 10, further comprising: exciting the antenna with a modified CPMG pulse train.

18. The method of claim 10, further comprising: connecting an electrical ground to the conductive cover for shielding the NMR antenna from alternating electric fields.

* * * * *